(12) United States Patent
Nandi et al.

(10) Patent No.: US 10,056,882 B2
(45) Date of Patent: Aug. 21, 2018

(54) ULTRA-LOW POWER STATIC STATE FLIP FLOP

(71) Applicant: TEXAS INSTRUMENTS INCORPORATED, Dallas, TX (US)

(72) Inventors: Suvam Nandi, Bangalore (IN); Badarish Mohan Subbannavar, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/391,465

(22) Filed: Dec. 27, 2016

(65) Prior Publication Data

US 2017/0194943 A1 Jul. 6, 2017

(30) Foreign Application Priority Data

Dec. 30, 2015 (IN) .......................... 7081/CHE/2015

(51) Int. Cl.
*H03K 3/012* (2006.01)
*H03K 3/3562* (2006.01)
*H03K 19/00* (2006.01)
*H03K 19/094* (2006.01)

(52) U.S. Cl.
CPC ......... *H03K 3/012* (2013.01); *H03K 3/35625* (2013.01); *H03K 19/0002* (2013.01); *H03K 19/09429* (2013.01)

(58) Field of Classification Search
CPC .. H03K 3/014; H03K 3/3562; H03K 3/35625; H03K 3/656182; H03K 3/356156; H03K 3/356147; H03K 3/65606; H03K 19/09429
See application file for complete search history.

(56) References Cited

U.S. PATENT DOCUMENTS

| | | | | |
|---|---|---|---|---|
| 6,023,179 A * | 2/2000 | Klass | ................... | H03K 3/0372 326/98 |
| 7,391,250 B1 * | 6/2008 | Chuang | ................ | H03K 3/0375 326/104 |
| 7,518,426 B1 * | 4/2009 | Smith | .................... | H03K 3/012 327/199 |
| 7,631,209 B2 * | 12/2009 | Schultz | .................. | H03K 3/012 326/46 |
| 7,868,677 B2 * | 1/2011 | Jain | ........................ | H03K 3/012 327/202 |
| 9,246,489 B1 * | 1/2016 | Nandi | ................ | H03K 19/0966 |

(Continued)

*Primary Examiner* — Thomas J Hiltunen
(74) *Attorney, Agent, or Firm* — John R. Pessetto; Charles A. Brill; Frank D. Cimino

(57) ABSTRACT

At least some embodiments are directed to a flip-flop that comprises a tri-state inverter and a master latch coupled to the tri-state inverter and comprising a first transistor, a first inverter, and a first logic gate. The master latch receives a clock signal. The flop also comprises a slave latch coupled to the master latch and comprising a second transistor and a second inverter. The slave latch receives the clock signal. The flop further comprises an enablement logic coupled to the master latch and comprising multiple, additional logic gates. The tri-state inverter, the master and slave latches, and the enablement logic are configured so that when a flip-flop input signal D and a flip-flop output signal Q are identical and the clock signal is toggled, a state of the master latch and a state of the slave latch remain static.

11 Claims, 2 Drawing Sheets

(56) References Cited

U.S. PATENT DOCUMENTS

| | | | |
|---|---|---|---|
| 2004/0246810 A1* | 12/2004 | Dike | G11C 7/1072 |
| | | | 365/233.1 |
| 2007/0146033 A1* | 6/2007 | Pesci | H03K 3/356156 |
| | | | 327/218 |
| 2008/0253500 A1* | 10/2008 | Tso | H03K 3/356156 |
| | | | 377/69 |
| 2011/0248760 A1* | 10/2011 | Chien | H03K 3/012 |
| | | | 327/211 |
| 2015/0358004 A1* | 12/2015 | Shirai | H03K 3/356104 |
| | | | 327/115 |
| 2016/0269002 A1* | 9/2016 | Zhang | H03K 3/012 |

* cited by examiner

ULTRA-LOW POWER STATIC STATE FLIP FLOP

CROSS-REFERENCE TO RELATED APPLICATIONS

The present application claims priority to Indian Provisional Patent Application No. 7081/CHE/2015, which was filed on Dec. 30, 2015, is titled "Novel Ultra Low Power Fully Clock Gated Static CMOS D Flip-Flop," and is hereby incorporated herein by reference in its entirety.

BACKGROUND

Flip-flops are storage devices that are commonly used in electronic circuits—and, more particularly, in sequential logic systems—to temporarily store binary data. Several types of flip-flops use system clock signals to regulate the receipt, storage, and output of binary data. Many such clock-based flip-flops use the clock inefficiently, particularly in instances where new, incoming data is identical to the data presently stored in the flip-flop. Thus, flip-flops that efficiently account for instances in which incoming data is identical to stored data are desired.

SUMMARY

At least some embodiments are directed to a flip-flop that comprises a tri-state inverter, a master latch coupled to the tri-state inverter and comprising a first transistor, a first inverter, and a first logic gate, the master latch receives a clock signal. The flip-flop further includes a slave latch coupled to the master latch and comprising a second transistor and a second inverter, the slave latch receives the clock signal. The flop also comprises an enablement logic coupled to the master latch and comprising multiple, additional logic gates. The tri-state inverter, the master and slave latches, and the enablement logic are configured so that when a flip-flop input signal D and a flip-flop output signal Q are identical and the clock signal is toggled, a state of the master latch and a state of the slave latch remain static. One or more of these embodiments may be supplemented using one or more of the following concepts, in any order and in any combination: wherein the first transistor is an NMOS switch, and wherein the master latch further comprises a second NMOS switch coupled to the NMOS switch and a PMOS switch coupled to the second NMOS switch; wherein the first inverter couples to a gate of the NMOS switch, and wherein an output of the tri-state inverter couples to an input of the first inverter and to an input of the first logic gate; wherein the multiple, additional logic gates in the enablement logic include an AND gate and an OR gate; wherein the first logic gate is a NAND gate; wherein the second transistor in the slave latch is an NMOS switch, and wherein the slave latch further comprises a second NMOS switch and a PMOS switch, a gate of the PMOS switch coupled to an output of the first logic gate, a node between the PMOS switch and the second NMOS switch coupled to the second inverter of the slave latch; wherein the slave latch further comprises a third inverter, an output of the third inverter couples to an input of another tri-state inverter; wherein the tri-state inverter and the another tri-state inverter are enabled and disabled by the clock signal and an output of the first logic gate.

At least some embodiments are directed to a flip-flop that comprises a tri-state inverter to receive an input signal D, and an enablement logic comprising a first inverter to receive the input signal D, an AND gate to receive an output of the first inverter and a slave latch node signal, and an OR gate to receive an output of the AND gate and a clock signal. The flop also comprises a master latch comprising a first NMOS switch coupled to a second NMOS switch and to a first PMOS switch, a gate of the second NMOS switch coupled to an output of a second inverter, a node between the first NMOS switch and the first PMOS switch coupled to an output of the tri-state inverter and to an input of a NAND gate, the NAND gate also receives an output of the OR gate. The flop further comprises a slave latch comprising a third NMOS switch coupled to a fourth NMOS switch and a second PMOS switch, a gate of the second PMOS switch coupled to an output of the NAND gate, a third inverter having an input coupled to another node between the second PMOS switch and the third NMOS switch, the third inverter provides an output signal Q. One or more of these embodiments may be supplemented using one or more of the following concepts, in any order and in any combination: wherein a gate of the first NMOS switch couples to the clock signal; wherein a gate of the first PMOS switch couples to the output of the NAND gate; wherein a gate of the third NMOS switch couples to the clock signal; wherein a gate of the fourth NMOS switch couples to the gate of the second NMOS switch; further comprising a fourth inverter in the slave latch that couples to the another node of the slave latch; further comprising another tri-state inverter in the slave latch, the another tri-state inverter couples to the fourth inverter, an output of the another tri-state inverter is provided to the another node of the slave latch; wherein the tri-state inverter and the another tri-state inverter are enabled and disabled by the clock signal and by the output of the NAND gate; wherein the first and second PMOS switches couple to a rail supply voltage At least some embodiments are directed to a method that comprises providing to a flip-flop an input signal D that is identical to an output signal Q of the flip-flop, the output signal Q having a first value. The method also comprises providing a clock signal to the flip-flop at a first bit value. The method further comprises passing the input signal D and the clock signal at the first bit value through a network of transistor switches, inverters, buffers, and logic gates such that the states of master and slave latches in the flip-flop hold the output signal Q at the first value. The method still further comprises toggling the clock signal to a second bit value, and passing the input signal D and the clock signal at the second bit value through the network of transistor switches, inverters, buffers, and logic gates such that the states of the master and slave latches remain static. One or more of these embodiments may be supplemented using one or more of the following concepts, in any order and in any combination: wherein the network comprises two PMOS switches, four NMOS switches, and a NAND gate; wherein the network further includes an AND gate and an OR gate, an output of the OR gate provided to the NAND gate.

BRIEF DESCRIPTION OF THE DRAWINGS

For a detailed description of various examples, reference will now be made to the accompanying drawings in which.

DETAILED DESCRIPTION

Traditional flip-flops are inefficient and consume excessive power at least because they contain one or more internal signals that change state when the clock signal provides a leading (or falling) edge—that is, when the clock signal toggles from 0 to 1 or vice versa. During such toggles, a traditional flip-flop may transfer the input D of the flip-flop to the output Q of the flip-flop, but such transfer entails state changes for one or more signals within the flip-flop. The novel flip-flop architecture disclosed herein achieves greater efficiency than traditional flip-flops at least because its master and slave latch states remain static (i.e., the internal signals applied to MOSFET gates, with the exception of clock signals, remain unchanged) when its input D and output Q are identical and the clock toggles between 0 and 1. Stated another way, the flip-flop has no signal switching activity (other than that directly related to clock signals) when Q equals D, irrespective of any clock toggling. Thus, minimal or no power is consumed when Q and D are the same. Additionally, the flip-flop requires no clock inverter or buffer in attendant clock trees because it uses internal signals in lieu of such components for the scenarios in which Q is not the same as D. The flip-flop architecture that achieves this goal is depicted in and described below with respect to FIGS. 1 and 2.

Figure 1:
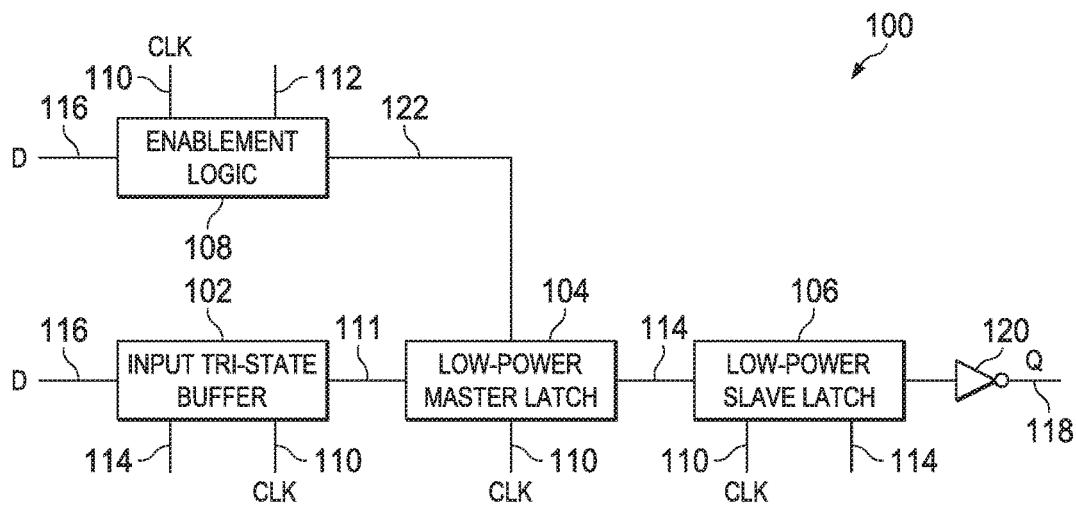
FIG. 1 is a block diagram of a flip-flop in accordance with various embodiments.

FIG. 1 is a block diagram of a flip-flop 100 in accordance with various embodiments. The flip-flop 100 includes an input tri-state inverter 102; a low-power master latch 104; a low-power slave latch 106; an enablement logic 108; a clock signal (CLK) 110; a node signal 111 (which represents the bit stored in the master latch 104); a node signal 112 (which represents the bit stored in the slave latch 106); a node signal 114; a flip-flop input signal (D) 116; a flip-flop output signal (Q) 118; an inverter 120; and a node signal 122. The tri-state inverter 102 receives CLK 110, node signal 114, and D 116 as inputs, and it outputs node signal 111. The enablement logic 108 receives CLK 110, node signal 112, and D 116 as inputs and provides node signal 122 as an output. The low-power master latch 104 receives the CLK 110 and the node signals 111 and 122 as inputs, and it provides node signal 114 as an output. The low-power slave latch 106 receives CLK 110 and node signal 114 as inputs. The low-power slave latch 106 provides an output that passes through an inverter 120 to produce the output signal (Q) 118. The low-power master latch 104, low-power slave latch 106, and the enablement logic 108 contain components—such as n-channel metal oxide semiconductor field effect transistor (NMOS) and/or p-channel metal oxide semiconductor field effect transistor (PMOS) switches, tri-state inverters, inverters, and/or logic gates (e.g., NAND gates, AND gates, OR gates)—that are configured to achieve the efficiencies described above by keeping the master and slave latch states static (i.e., keeping the bits stored in the master and slave latches static by keeping all signals within the master and slave latches static) when D equals Q and CLK toggles between 0 and 1.

Figure 2:
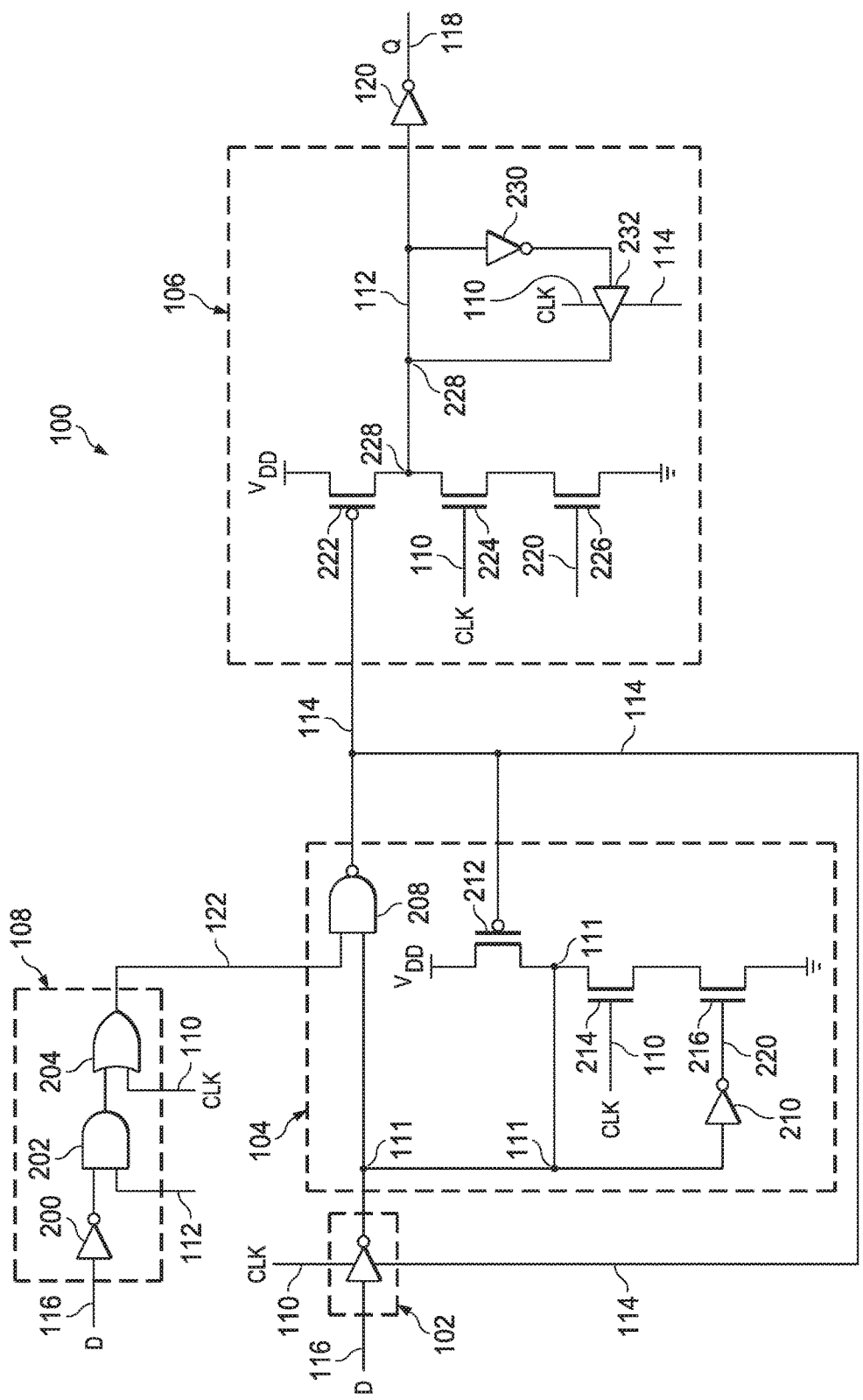
FIG. 2 is a circuit schematic of a flip-flop in accordance with various embodiments.

FIG. 2 is a circuit schematic of the flip-flop 100 in accordance with various embodiments. In some embodiments, the enablement logic 108 comprises an inverter 200 that receives D 116 as an input and provides its output to a logic AND gate 202. The AND gate 202 receives the output of the inverter 200 as an input and further receives the signal present at node 112 (in the slave latch 106) as another input. The AND gate 202 provides its output as an input to a logic OR gate 204. The OR gate 204 receives CLK 110 as another input and provides a signal 122 as an output. In some embodiments, the input tri-state inverter 102 is enabled by CLK 110 and by the node signal 114, which is obtained from the node positioned between the master and slave latches (and is the output of the master latch). The tri-state inverter 102 receives D 116 as an input and provides node signal 111 as an output. In some embodiments, the tri-state inverter 102 is implemented as an inverter followed by a transmission gate, and the output of this inverter may be input to the AND gate 202, thus eliminating the need for the inverter 200.

Still referring to FIG. 2, in some embodiments, the low-power master latch 104 comprises a logic NAND gate 208 that receives as inputs the signal 122 provided by the OR gate 204 and the signal 111 output by the tri-state inverter 102. The NAND gate 208 outputs the node signal 114. The low-power master latch 104, in some embodiments, additionally includes a PMOS switch 212 and NMOS switches 214 and 216. The source of the PMOS switch 212 couples to a rail supply voltage $V_{DD}$. The gate of the PMOS switch 212 couples to the node that carries signal 114. The drain of the PMOS switch 212 couples to the drain of the NMOS switch 214. The gate of the NMOS switch 214 couples to CLK 110, and the source of the NMOS switch 214 couples to the drain of the NMOS switch 216. The gate of the NMOS switch 216 is controlled by signal 220, which is the output of an inverter 210. The source of the NMOS switch 216 couples to ground. The inverter 210 receives the signal 111 as its input. The drain of the PMOS switch 212 and the drain of the NMOS switch 214 couple directly to an input of the NAND gate 208 via node 111. Thus, the signal present at this node is the same as the signal present at the input of the NAND gate 208.

Still referring to FIG. 2, in some embodiments, the low-power slave latch 106 comprises a PMOS switch 222 and NMOS switches 224 and 226. The source of the PMOS switch 222 couples to $V_{DD}$, and the gate of the PMOS switch 222 is controlled by signal 114, which is the output of the NAND gate 208. The drain of the PMOS switch 222 couples to the drain of NMOS switch 224. The gate of NMOS switch 224 is controlled by CLK 110, and the source of the NMOS switch 224 couples to the drain of the NMOS switch 226. The gate of the NMOS switch 226 is controlled by signal 220, which is the output of the inverter 210. The source of the NMOS switch 226 couples to ground. Node 228 is positioned where the drain of the PMOS switch 222 and the drain of the NMOS switch 224 connect. Signal 112, which is present on node 228, is provided to inverter 120. The inverter 120, in turn, outputs Q 118. The signal 112 is also provided to inverter 230, the output of which is provided to tri-state inverter 232. The tri-state inverter 232 is enabled by CLK 110 and signal 114, and its output couples to node 228. Thus, the signal 112 is present at the output of the tri-state inverter 232.

The operation of the flip-flop 100 is now described to illustrate the mitigated power consumption achieved by avoiding state changes when D and Q are identical and CLK toggles between 0 and 1. The operation is first described assuming D and Q are both simultaneously equal to 1 and further assuming that CLK toggles between 0 and 1. The operation is then described assuming D and Q are both simultaneously equal to 0 and further assuming that CLK toggles between 0 and 1. Finally, operation when D and Q are not identical is described.

When D 116 and Q 118 are both 1 and CLK 110 is 0, the signal 114 (which may be the inverse of the CLK 110) is 1, and so the tri-state inverter 102 is enabled. Thus, the buffer 102 inverts the value at D 116—which is 1—to cause the signal 111 to be 0. The tri-state inverter 102 holds the signal 111 at 0 as along as it is enabled. Because signal 114 is 1, the PMOS switch 212 is off, and because CLK 110 is 0, the NMOS switch 214 is off. Thus, the signal 111 is unaffected by the $V_{DD}$ and ground connections to the PMOS switch 212 and NMOS switch 216, respectively. The state of the enablement logic 108 is irrelevant because, when the signal 111 is held at 0, the signal 114 will be 1 regardless of the state of the enablement logic 108. Because Q 118 is 1, the signal 112 is 0, and the inverter 230 and tri-state inverter 232 operate together to maintain the signal 112 at 0. Further, because the signal 114 is 1, the PMOS switch 222 is off, and the signal 112 is unaffected by the $V_{DD}$ connection to the PMOS switch 222. Because CLK 110 is 0, the signal 112 is likewise unaffected by the ground connection to the NMOS switch 226.

When a typical flip-flop clock toggles from 0 to 1, the bit present at the input D is transferred to the output Q. As explained above, this transfer of the bit entails switched states internal to the flop and, thus, excessive power consumption. As now described, however, the flip-flop 100 undergoes no internal signal state changes when the CLK 110 toggles from 0 to 1. Specifically, when D 116 and Q 118 are both 1 and CLK 110 toggles from 0 to 1, the tri-state inverter 102 is disabled, the NMOS switch 214 is turned on, and the NMOS switch 224 is turned on. Further, the NMOS switches 216 and 226 are both on because they are controlled by signal 220, which is produced when the inverter 210 inverts the signal 111, which is 0. Thus, the state of signal 111 remains 0, and the signal 114 remains at 1. Similarly, NMOS switches 224 and 226 pull signal 112 at node 228 to ground (i.e., 0), which maintains flop output Q 118 at 1. The tri-state inverter 232 is disabled because CLK 110 is 1.

The behavior of the flip-flop 100 when D and Q are both 0 is now described. Assume that CLK 110 is 0. Accordingly, the tri-state inverter 102 inverts the D 116 input and produces a signal 111 with a value of 1. Because CLK 110 is 0, the NMOS switch 214 is off, and so the signal 111 is unaffected by the ground connection to NMOS switch 216. In the enablement logic 108, the D 116 input of 0 is inverted by inverter 200 to produce an input to the AND gate 202 of 1. Further, the signal 112 input to the AND gate 202 is also 1 (since the output Q 118 is 0 and thus signal 112 at node 228 in the slave latch 106 is 1). Thus, the output of the AND gate 202 is 1. The CLK 110 is 0, but because the output of the AND gate 202 is 1, the output signal 122 of the OR gate 204 is 1. Because both inputs to the NAND gate 208 are 1, the signal 114 is 0. This activates the PMOS switch 212, which causes the signal 111 to be pulled up to $V_{DD}$ (i.e., 1). In this manner, the signal 111 is maintained at 1. Further, because signal 114 is 0, the PMOS switch 222 is on and the signal 112 is pulled up to $V_{DD}$ (because CLK 110 is 0, NMOS switch 224 is off and the ground connection coupling to NMOS switch 226 does not affect the signal 112). The inverter 230 and the enabled, tri-state inverter 232—in tandem with the $V_{DD}$ connection to node 228—maintain signal 112 at 1. Because signal 112 is 1, the inverter 120 causes the output signal Q 118 to be 0.

When Q and D are both 0 and when CLK 110 toggles from 0 to 1, no internal state changes occur within the flip-flop 100, and thus power is conserved. Stated another way, the states of the master and slave latches remain static when Q and D are both 0 and the CLK 110 toggles. In particular, the CLK 110 toggling to 1 causes the tri-state inverter 102 to be disabled, the NMOS switch 214 to be turned on, and the NMOS switch 224 to be turned on. The NMOS switch 216 is off and so the ground connection thereto does not affect the signal 111, and the signal 111 remains at 1. Further, the CLK 110 toggling to 1 does not change the output of the OR gate 204, and so the NAND gate 208 still receives two signals at 1 and outputs signal 114 at 0. The signal 114 thus keeps the PMOS switch 212 on and signal 111 is kept pulled up to $V_{DD}$. Thus, signal 111 is held at 1 and signal 114 is held at 0. These signals do not change state as a result of the CLK 110 toggling from 0 to 1. Because signal 114 is 0, the PMOS switch 222 is on and signal 228 is pulled up to $V_{DD}$. Further, although NMOS switch 224 is on due to CLK 110 being 1, signal 220 is 0, and so the NMOS switch 226 is off. Thus, the ground connection coupled to the NMOS switch 226 does not affect signal 112. The tri-state inverter 232 is off because CLK 110 is 1. Because the signal 112 is 1, the inverter 120 produces an output signal Q 118 at 0. Thus, the signals 112 and Q 118 remain unchanged when the CLK 110 toggles from 0 to 1, and power consumption is mitigated compared to other types of flip-flops.

For completeness, the operation of the flip-flop 100 when D is 0 and Q is 1 is described, followed by a description of the operation of the flip-flop 100 when D is 1 and Q is 0. When D 116 is 0 and CLK 110 is 0, signal 111 is driven to 1. In addition, the output of inverter 200 is 1, and signal 112 is 0. Thus, the output of the AND gate 202 is 0, and because CLK 110 is 0, the signal 122 is 0. Thus, the NAND gate 208 drives signal 114 to 1. As a result of the signal 114 being 1, both PMOS switches 212 and 222 are off, and the circuit is unaffected by the $V_{DD}$ connections coupling to these PMOS switches. Further, because CLK 110 is 0, the NMOS switches 214 and 224 are off, so the circuit is unaffected by the ground connections to NMOS switches 216 and 226. Because Q 118 is 1, signal 112 is 0, and the inverter 230 and tri-state inverter 232 maintain signal 112 at 0. When CLK 110 toggles from 0 to 1, signal 122 becomes 1. Because signal 111 is 1 and signal 122 is now 1, signal 114 becomes 0 due to the NAND gate 208. This causes the PMOS switch 212 to turn on, and signal 111 is pulled up to $V_{DD}$. This maintains signal 114 at 0. Signal 114 being at 0 also turns on PMOS switch 222, which pulls signal 112 to VDD. This causes Q 118 to switch from 1 to 0. This transition of Q 118 from 1 to 0 is the desired behavior when D is 0, Q is 1, and a clock edge is received.

When D 116 is 1, Q 118 is 0 and CLK 110 is 0, signal 111 is driven to 0, and the signal 122 is also driven to 0. Thus, the NAND gate 208 drives signal 114 to 1. Because signal 114 is 1, the PMOS switches 212 and 222 are off, and so the $V_{DD}$ connections thereto do not affect the circuit. Similarly, because Q 118 is 0, signal 112 is 1, and the inverter 230 and tri-state inverter 232 maintain signal 112 at 1. The NMOS switches 214 and 224 are off, and so the ground connections to NMOS switches 216 and 226 do not affect the circuit. When CLK 110 toggles to 1, both NMOS switches 214 and 216 are on, and signal 111 is pulled to ground (i.e., 0). As a result, signal 114 is driven to 1. Likewise, NMOS switches 224 and 226 are on, and thus signal 112 is pulled down to 0. Thus, Q 118 is driven to 1 by the inverter 120. This transition of Q 118 from 0 to 1 is the desired behavior when D is 1, Q is 0, and a clock edge is received.

Figure 3:
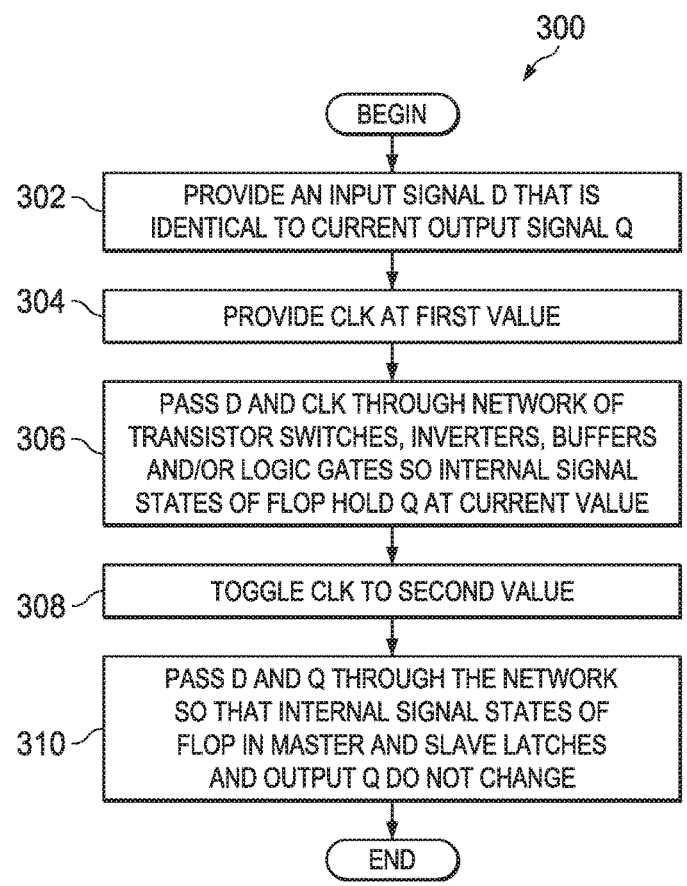
FIG. 3 is a flow diagram of a method in accordance with various embodiments.

FIG. 3 is a flow diagram of a method 300 for using the flip-flop architecture described herein. The method 300 begins by providing an input signal D 116 that is identical to the first output signal Q 118 (step 302). The method 300 further comprises providing a clock signal CLK 110 at a first value (e.g., 0) (step 304). The method 300 next includes passing D 116 and CLK 110 through a network of transistor switches, inverters, buffers, and/or logic gates (e.g., NAND gates, OR gates, AND gates) such that the internal signal states of the flop hold the output signal Q 118 at the first output signal Q 118 (step 306). The method 300 further comprises toggling the CLK 110 to a second value (e.g., 1) (step 308). The method 300 next includes passing D 116 and CLK 110 through the network of transistor switches, inverters, buffers, and/or logic gates such that the internal signal states of the flop in the master and slave latches do not change (i.e., remain static) and the output signal Q 118 likewise remains unchanged (step 310). The method 300 may be modified as desired, including by adding, deleting, modifying or rearranging one or more steps.

Numerous variations and modifications to the foregoing, illustrative embodiments will become apparent to those skilled in the art once the above disclosure is fully appreciated. It is intended that the following claims be interpreted to embrace all such variations and modifications.

What is claimed is:

1. A flip-flop, comprising:
a tri-state inverter;
a master latch coupled to the tri-state inverter and comprising a first transistor, a first inverter, and a first logic gate, the master latch receives a clock signal;
a slave latch coupled to the master latch and comprising a second transistor and a second inverter, the slave latch receives the clock signal; and
an enablement logic coupled to the master latch and comprising multiple, additional logic gates,
wherein the tri-state inverter, the master and slave latches, and the enablement logic are configured so that when a flip-flop input signal D and a flip-flop output signal Q are identical and the clock signal is toggled, a state of the master latch and a state of the slave latch remain static;
wherein the first transistor is an NMOS switch, and wherein the master latch further comprises a second NMOS switch coupled to the NMOS switch and a PMOS switch coupled to the second NMOS switch;
wherein the first inverter couples to a gate of the NMOS switch, and wherein an output of the tri-state inverter couples to an input of the first inverter and to an input of the first logic gate.

2. A flip-flop, comprising:
a tri-state inverter;
a master latch coupled to the tri-state inverter and comprising a first transistor, a first inverter, and a first logic gate, the master latch receives a clock signal;
a slave latch coupled to the master latch and comprising a second transistor and a second inverter, the slave latch receives the clock signal; and
an enablement logic coupled to the master latch and comprising multiple, additional logic gates,
wherein the tri-state inverter, the master and slave latches, and the enablement logic are configured so that when a flip-flop input signal D and a flip-flop output signal Q are identical and the clock signal is toggled, a state of the master latch and a state of the slave latch remain static;
wherein the slave latch further comprises a third inverter, an output of the third inverter couples to an input of another tri-state inverter;
wherein the tri-state inverter and the another tri-state inverter are enabled and disabled by the clock signal and an output of the first logic gate.

3. A flip-flop, comprising:
a tri-state inverter to receive an input signal D;
an enablement logic comprising a first inverter to receive the input signal D, an AND gate to receive an output of the first inverter and a slave latch node signal, and an OR gate to receive an output of the AND gate and a clock signal;
a master latch comprising a first NMOS switch coupled to a second NMOS switch and to a first PMOS switch, a gate of the second NMOS switch coupled to an output of a second inverter, a node between the first NMOS switch and the first PMOS switch coupled to an output of the tri-state inverter and to an input of a NAND gate, the NAND gate also receives an output of the OR gate; and
a slave latch comprising a third NMOS switch coupled to a fourth NMOS switch and a second PMOS switch, a gate of the second PMOS switch coupled to an output of the NAND gate, a third inverter having an input coupled to another node between the second PMOS switch and the third NMOS switch, the third inverter provides an output signal Q.

4. The flip-flop of claim 3, wherein a gate of the first NMOS switch couples to the clock signal.

5. The flip-flop of claim 3, wherein a gate of the first PMOS switch couples to the output of the NAND gate.

6. The flip-flop of claim 3, wherein a gate of the third NMOS switch couples to the clock signal.

7. The flip-flop of claim 3, wherein a gate of the fourth NMOS switch couples to the gate of the second NMOS switch.

8. The flip-flop of claim 3, further comprising a fourth inverter in the slave latch that couples to the another node of the slave latch.

9. The flip-flop of claim 8, further comprising another tri-state inverter in the slave latch, the another tri-state inverter couples to the fourth inverter, an output of the another tri-state inverter is provided to the another node of the slave latch.

10. The flip-flop of claim 9, wherein the tri-state inverter and the another tri-state inverter are enabled and disabled by the clock signal and by the output of the NAND gate.

11. The flip-flop of claim 3, wherein the first and second PMOS switches couple to a rail supply voltage.

* * * * *